(12) United States Patent
Wang

(10) Patent No.: US 11,924,981 B2
(45) Date of Patent: Mar. 5, 2024

(54) DISPLAY DEVICE

(71) Applicant: BOE Technology Group Co., Ltd., Beijing (CN)

(72) Inventor: Zifeng Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 269 days.

(21) Appl. No.: 17/413,961

(22) PCT Filed: Dec. 29, 2020

(86) PCT No.: PCT/CN2020/140912
§ 371 (c)(1),
(2) Date: Jun. 15, 2021

(87) PCT Pub. No.: WO2021/179757
PCT Pub. Date: Sep. 16, 2021

(65) Prior Publication Data
US 2022/0312603 A1    Sep. 29, 2022

(30) Foreign Application Priority Data

Mar. 10, 2020  (CN) .......................... 202020289629.3

(51) Int. Cl.
*H05K 5/00*    (2006.01)
(52) U.S. Cl.
CPC .................... *H05K 5/0017* (2013.01)
(58) Field of Classification Search
None
See application file for complete search history.

(56) References Cited

U.S. PATENT DOCUMENTS

| | | | | |
|---|---|---|---|---|
| 5,613,237 A * | 3/1997 | Bent | ...................... | H04B 1/086 |
| | | | | 361/752 |
| 8,045,934 B2 * | 10/2011 | Roh | ...................... | H01Q 1/243 |
| | | | | 455/90.3 |
| 8,164,898 B2 * | 4/2012 | Chen | .................... | H04M 1/0252 |
| | | | | 455/90.3 |
| 8,350,149 B2 * | 1/2013 | Chen | .................... | H04M 1/0283 |
| | | | | 361/810 |

(Continued)

FOREIGN PATENT DOCUMENTS

| CN | 101528014 A | 9/2009 |
|---|---|---|
| CN | 102981294 A | 3/2013 |

(Continued)

OTHER PUBLICATIONS

International Search Report for PCT/CN2020/140912 dated Mar. 25, 2021.

*Primary Examiner* — Xanthia C Relford
(74) *Attorney, Agent, or Firm* — Ling Wu; Stephen Yang; Ling and Yang Intellectual Property

(57) ABSTRACT

A display device includes a display module, a back plate, and a bracket; a side face of the display module facing away from a display side is fixed on a first side face of the back plate, the bracket is fixed on a second side face of the back plate facing away from the first side face; the display module includes a display panel and a first frame, the first frame being disposed on a part of the display panel close to an edge, the bracket includes a second frame, and the display panel is positioned on an inner side of a frame body formed by the first frame and the second frame.

14 Claims, 10 Drawing Sheets

(56) References Cited

U.S. PATENT DOCUMENTS

| | | | | |
|---|---|---|---|---|
| 8,436,958 | B2 * | 5/2013 | Lee | H10K 50/8423 |
| | | | | 349/40 |
| 8,716,598 | B2 * | 5/2014 | Pan | H04B 1/3888 |
| | | | | 174/559 |
| 8,801,050 | B2 * | 8/2014 | Chen | H04M 1/0249 |
| | | | | 292/37 |
| 8,933,347 | B2 * | 1/2015 | Kiple | C25D 11/022 |
| | | | | 174/541 |
| 8,954,123 | B2 * | 2/2015 | Suzuki | H04M 1/04 |
| | | | | 455/575.8 |
| 8,977,328 | B2 * | 3/2015 | Cheng | H04B 1/3888 |
| | | | | 455/575.8 |
| 9,002,419 | B2 * | 4/2015 | Satou | G06F 3/041 |
| | | | | 455/90.3 |
| 9,116,662 | B1 * | 8/2015 | Song | G06F 1/1601 |
| 9,253,913 | B2 * | 2/2016 | Yu | H05K 7/1461 |
| 9,436,027 | B2 * | 9/2016 | Kubo | H04N 5/64 |
| 9,490,861 | B2 * | 11/2016 | Kawanishi | G06F 1/1626 |
| 9,839,151 | B2 * | 12/2017 | Arao | H05K 5/0004 |
| 10,165,697 | B2 * | 12/2018 | Kim | F16M 11/10 |
| 10,824,202 | B2 * | 11/2020 | Okada | G06F 1/1626 |
| 10,845,631 | B2 * | 11/2020 | Kim | G02F 1/133308 |
| 11,089,697 | B2 * | 8/2021 | Takahashi | G09F 9/30 |
| 2002/0022459 | A1 * | 2/2002 | Kobayashi | H04B 1/3833 |
| | | | | 343/702 |
| 2003/0222850 | A1 | 12/2003 | Hung | |
| 2006/0028594 | A1 * | 2/2006 | Chou | G02F 1/133308 |
| | | | | 349/58 |
| 2014/0053392 | A1 * | 2/2014 | Rothkopf | H04M 1/0266 |
| | | | | 29/593 |
| 2014/0101980 | A1 * | 4/2014 | Best | G09F 7/18 |
| | | | | 40/606.03 |
| 2014/0184983 | A1 * | 7/2014 | Wu | G02F 1/133608 |
| | | | | 349/61 |
| 2016/0286670 | A1 | 9/2016 | Wang et al. | |
| 2017/0075380 | A1 * | 3/2017 | Park | G06F 1/1681 |
| 2017/0295655 | A1 * | 10/2017 | Jung | G06F 1/20 |

FOREIGN PATENT DOCUMENTS

| | | | |
|---|---|---|---|
| CN | 104021733 A | 9/2014 | |
| CN | 104950498 A | 9/2015 | |
| CN | 108022511 A | 5/2018 | |
| CN | 210722258 U | 6/2020 | |
| CN | 210896389 U | 6/2020 | |
| WO | WO-2019146333 A1 * | 8/2019 | G09F 9/30 |

* cited by examiner

DISPLAY DEVICE

CROSS-REFERENCE TO RELATED APPLICATION

The present application claims the priority of the Chinese patent application No. 202020289629.3, entitled "Display Device", filed to the CNIPA on Mar. 10, 2020, the content of which should be interpreted as being incorporated into the present application by reference.

TECHNICAL FIELD

Embodiments of the present application relate to, but are not limited to, the technical field of display, in particular to a display device.

BACKGROUND

Some whole organic light emitting diode (OLED) display devices include multiple modules, such as a display screen, a back plate, a bracket, a frame body, a system, etc., as well as a connector for fixing and assembling, such as colloid, a magnet, a screw, etc., and also wiring for telecommunication intercommunication, etc. For a whole OLED display device, it is required to design and arrange a large quantity of materials, to integrate all components into multiple modules according to a technical direction, and finally to integrate and assemble the multiple modules to form a product. In some technologies, an OLED display device has relatively many modules, which is inconvenient to be assembled in a whole machine assembly process, having relatively low assembly efficiency.

SUMMARY

The following is a summary of subject matter described in detail herein. This summary is not intended to limit the protection scope of the claims.

An embodiment of the present application provides a display device, which includes a display module, a back plate, and a bracket; a side face of the display module facing away from a display side is fixed on a first side face of the back plate, the bracket is fixed on a second side face of the back plate facing away from the first side face; the display module includes a display panel and a first frame, the first frame being disposed on a part of the display panel close to an edge, the bracket includes a second frame, and the display panel is positioned on an inner side of a frame body formed by the first frame and the second frame.

Other aspects will become apparent upon reading and understanding accompanying drawings and the detailed description.

BRIEF DESCRIPTION OF DRAWINGS

The accompanying drawings are used to provide an understanding of embodiments of the present application, form a part of the specification, and explain technical solutions of the embodiments of the present application together with embodiments of the present application, and do not constitute a limitation on the technical solutions of embodiments of the present application.

DETAILED DESCRIPTION

Those of ordinary skill in the art should understand that modifications or equivalent substitutions may be made to technical solutions of embodiments of the present application without departing from the spirit and the scope of the technical solutions of embodiments of the present application, which shall be covered by the scope of the claims of the present application.

Figure 1:
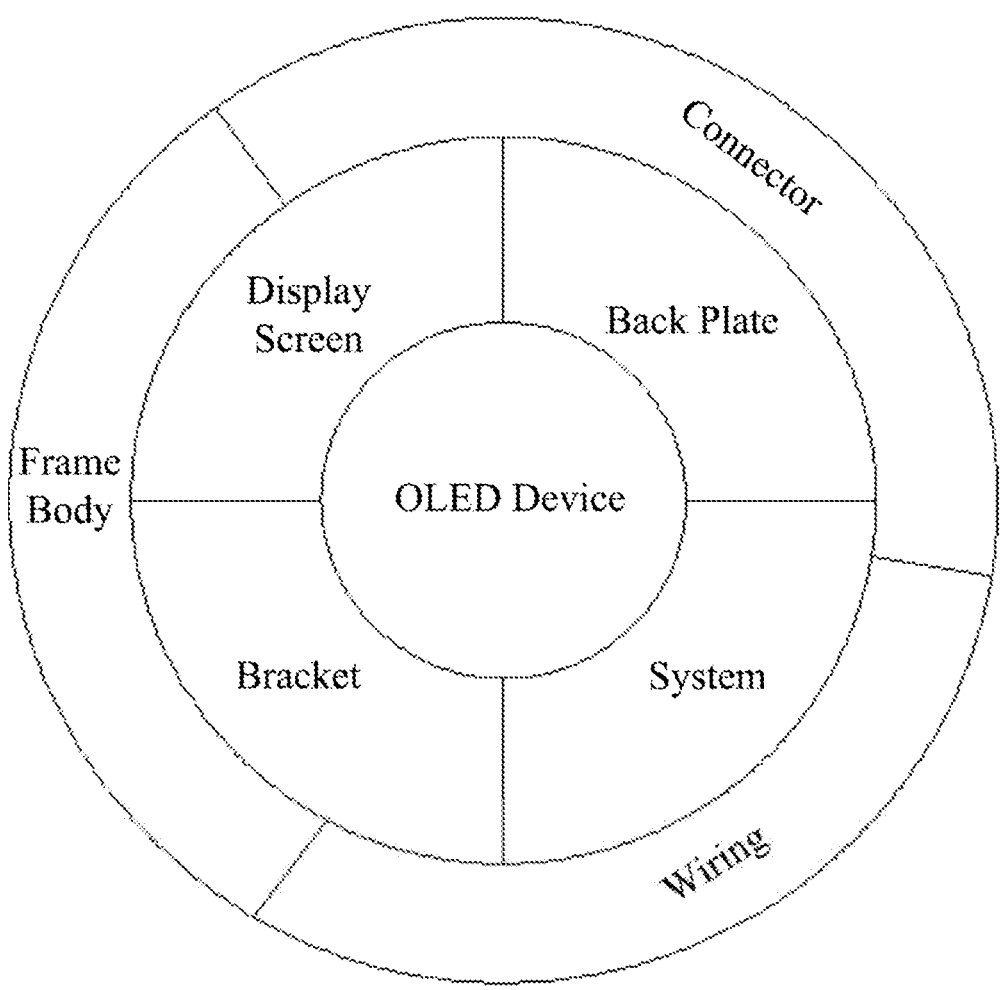
FIG. 1 is a schematic diagram of classification of main modules and auxiliary parts of an OLED display device in some technologies.

As shown in FIG. 1, in some technologies, main modules of an OLED display device include a display screen, a bracket, a back plate, and a system. These modules represent different technical directions, wherein, the display screen mainly involves a display technology, the back plate mainly involves a sheet metal technology, the system mainly involves an electronic device such as a system circuit board, and the bracket mainly involves sheet a sheet metal or injection molding technology, etc. In addition, the OLED display device also includes a frame body for protecting the display screen, wherein the frame body is also a main module component of the OLED display device, and a material of the frame body may be metal or plastic, etc. In addition, the OLED display device also includes some connectors for fixing, such as colloid, a magnet, a screw, etc., as well as wiring for telecommunication intercommunication between the system and the display screen, and between circuit boards. For a whole OLED display device, it is required to design and arrange a large quantity of materials, to integrate all components into multiple modules according to a technical direction, and finally to integrate and assemble the multiple modules to form a product. In some technologies, a OLED display device has relatively many modules, which is inconvenient to be assembled in a whole machine assembly process, having a relatively low assembly efficiency.

Based on the above technical problem existing in the OLED display device, as shown in FIGS. 2a to 4, and FIG. 6, an embodiment of the present application provides a display device, which includes a display module 1, a back plate 2, and a bracket 3. A side face of the display module 1 facing away from a display side is fixed on a first side face 201 of the back plate 2, the bracket 3 is fixed on a second side face 202 of the back plate 2 facing away from the first side face 201. The display module 1 includes a display panel 101 and a first frame 102, the first frame 102 being disposed on a part of the display panel 101 close to an edge, the bracket 3 includes a second frame 301, and the display panel 101 is positioned on an inner side of a frame body formed by the first frame 102 and the second frame 301.

In an embodiment of the present application, a shape of the frame body formed by the first frame 102 and the second frame 301 is adapted to a shape of an edge profile of the display panel 101. For example, the edge profile of the display panel 101 is rectangular, then the shape of the frame body formed by the first frame 102 and the second frame 301 is rectangular, and the first frame 102 and the second frame 301 are positioned at different side edges of the display panel 101. The display panel 101 may be planar or curved, for example.

In a display device of an embodiment of the present application, a first frame 102 is disposed on a display panel 101, a second frame 301 is disposed on a bracket 3, and the display panel 101 is positioned on an inner side of the frame body formed by the first frame 102 and the second frame 301. In this way, the frame body is designed separately on the display module 1 and the bracket 3. Compared with the OLED display device mentioned above, the frame body is omitted as a separate module. Therefore, an assembly act of a frame body module may be omitted in an assembly process of the whole display device, the assembly is more convenient and quicker, and assembly efficiency is high.

In some exemplary embodiments, as shown in FIGS. 2a, 2b, 4, and 6, the display panel 101 includes opposite first and second side edges 1011 and 1012, and opposite third and fourth side edges 1013 and 1014. The display module 1 includes the two first frames 102, wherein the two first frames 102 are respectively disposed on a part close to the first side edge 1011 and a part close to the second side edge 1012 of the display panel 101. The bracket 3 includes the two second frames 301, wherein the two second frames 301 are respectively disposed close to the third side edge 1013 and the fourth side edge 1014 of the display panel 101. In an example of the present embodiment, the display panel 101 may be a rectangular planar panel or a curved panel. A frame body enclosed by the two first frames 102 and the two second frames 301 has a same shape as an edge profile of the display panel 101, for example, a rectangle.

Figure 2A:
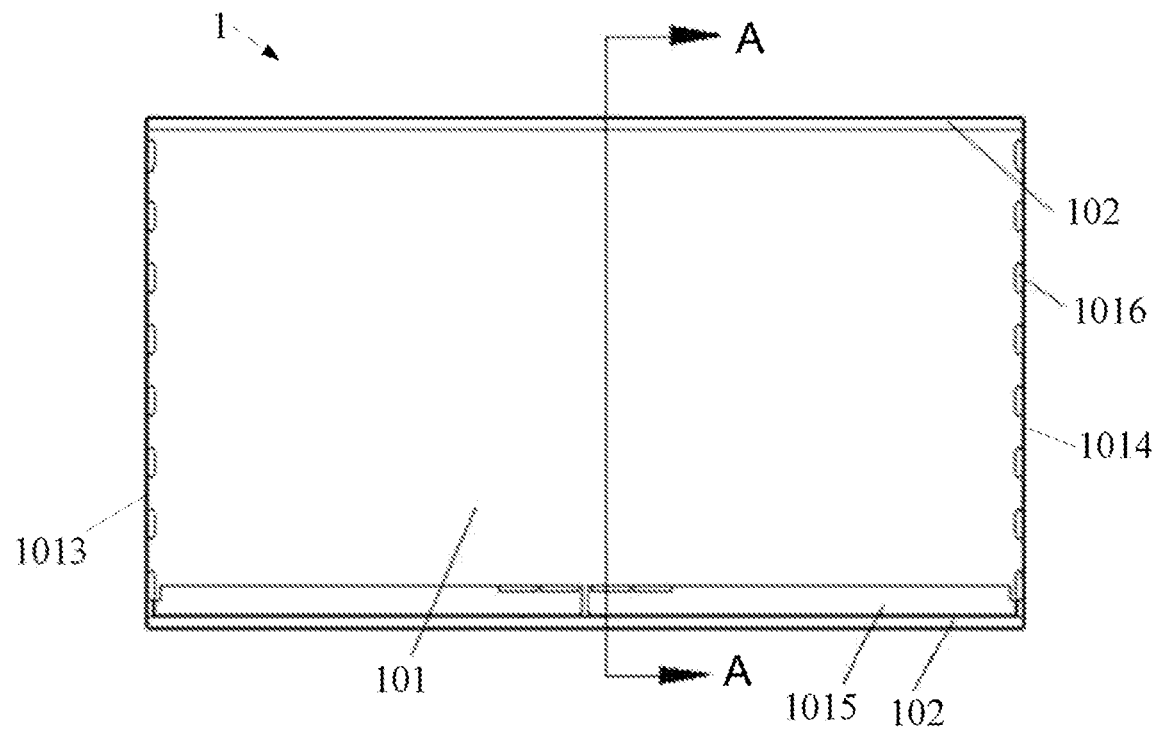
FIG. 2a is a schematic structural diagram of a side face, which faces away from a display side, of a display module of a display device according to some exemplary embodiment of the present application.
Figure 2B:
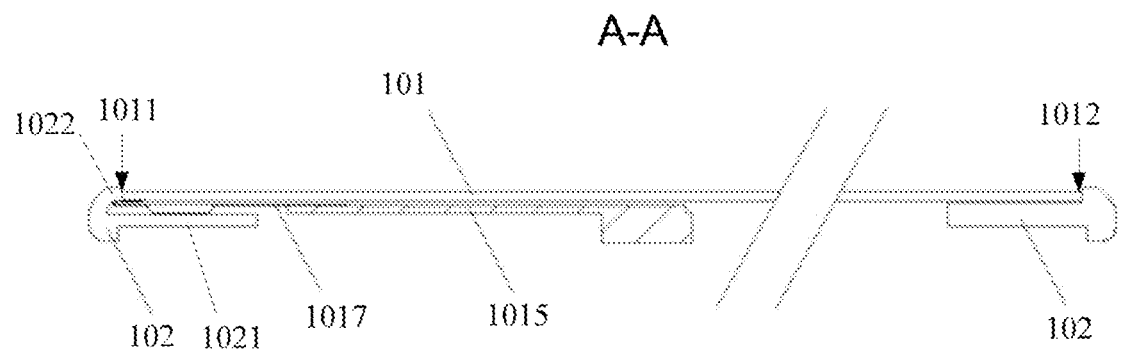
FIG. 2b is a sectional view taken along A-A in FIG. 2a in some exemplary embodiments of the present application.

In some exemplary embodiments, as shown in FIGS. 2a and 2b, the first frame 102 includes a first fixing plate 1021 and a first convex rib 1022 disposed on the first fixing plate 1021, wherein the first fixing plate 1021 is fixed on a side face of the display panel 101 facing away from a display side, and the first convex rib 1022 abuts against a side edge of the display panel 101 close to the first frame 102. In an example of the present embodiment, the first fixing plate 1021 of the first frame 102 may be attached to the side face of the display panel 101 facing away from the display side, and the first fixing plate 1021 and the display panel 101 may be bound and fixed by adhesive tape or adhesive. In the present embodiment, the first frame 102 and the display panel 101 are modularized to form a display module 1. The first frame 102 may protect an edge of the display panel 101 during a whole machine assembly process. In addition, attaching without seams may be realized based on the edge of the display panel 101 in a process of pasting the first frame 102 on the display panel 101, to enhance appearance effect of the display module 1.

Figure 3A:
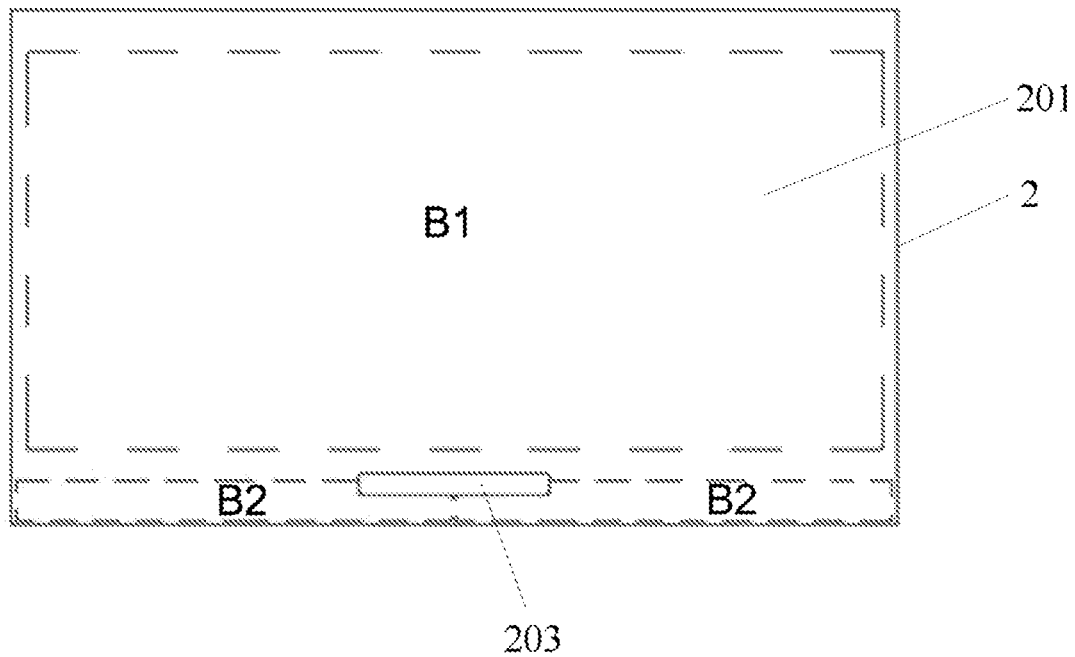
FIG. 3a is a schematic structural diagram of a first side face of a back plate of a display device according to some exemplary embodiments of the present application.
Figure 3B:
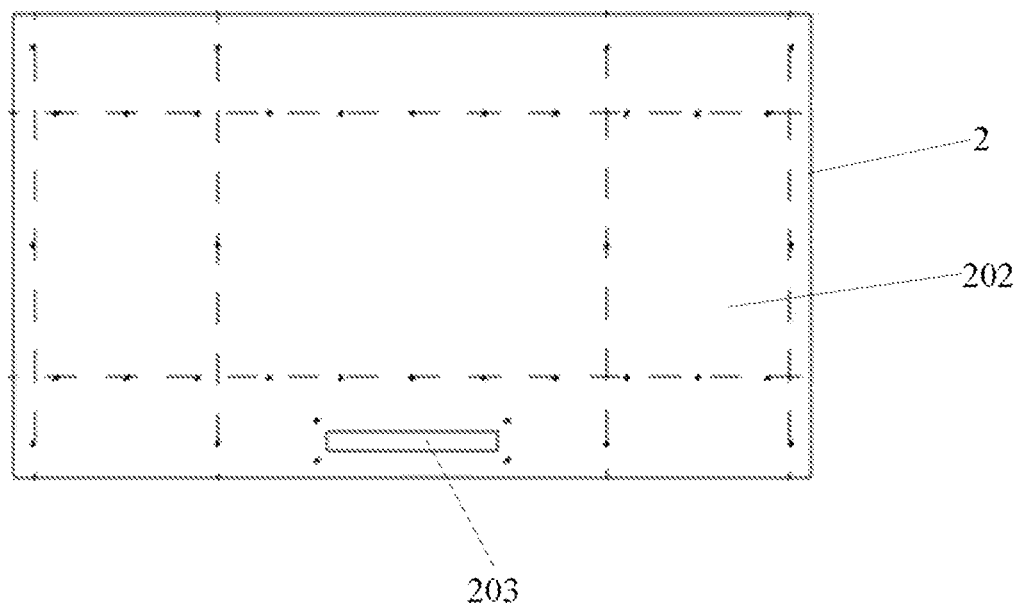
FIG. 3b is a schematic structural diagram of a second side face of a back plate of FIG. 3a in some exemplary embodiments of the present application.

In some exemplary embodiments, as shown in FIG. 2b, the display module 1 further includes multiple Chip On Films (COFs) disposed at a first side edge 1011 of the display panel 101, and at least one driving circuit board 1015 bound and connected with the multiple chip on films, wherein the chip on films and the driving circuit board 1015 are fixed on the side face of the display panel 101 facing away from the display side, and an avoidance part avoiding the chip on films is disposed on the first fixing plate 1021. As shown in FIG. 2b, in an example of the present embodiment, multiple chip on films disposed at the first side edge 1011 of the display panel 101 may be source cofs 1017, one end of multiple source cofs 1017 is bound and connected with the display panel 101, and another end is bound and connected with the driving circuit board 1015 (two driving circuit boards 1015 are shown in FIG. 2a), which are used for transmitting a signal produced by the driving circuit board 1015 to the display panel 101, driving the display panel 101 to display. A groove may be disposed at a position corresponding to the source cof 1017, on a side face of the first fixing plate 1021 facing the display panel 101, so as to form the avoidance part, and a rest part of the side face of the first fixing plate 1021 facing the display panel 101 may be attached to and fixed with the display panel 101 (adhesive may be used for splicing and fixing). As shown in FIG. 2a, multiple gate cofs 1016 may be bound and connected at both a position of the third side edge 1013 and a position of the fourth side edge 1014 of the display panel 101. As shown in FIG. 3a and FIG. 3b, a wiring hole 203 is disposed near a side edge of the back plate 2 corresponding to the first side edge 1011 of the display panel 101, and wiring connected on the driving circuit board 1015 of the display panel 101 passes through the wiring hole 203 on the back plate 2 and is connected with a system circuit board 402 (shown in FIG. 5*a*) of a system circuit module 4.

Figure 4:
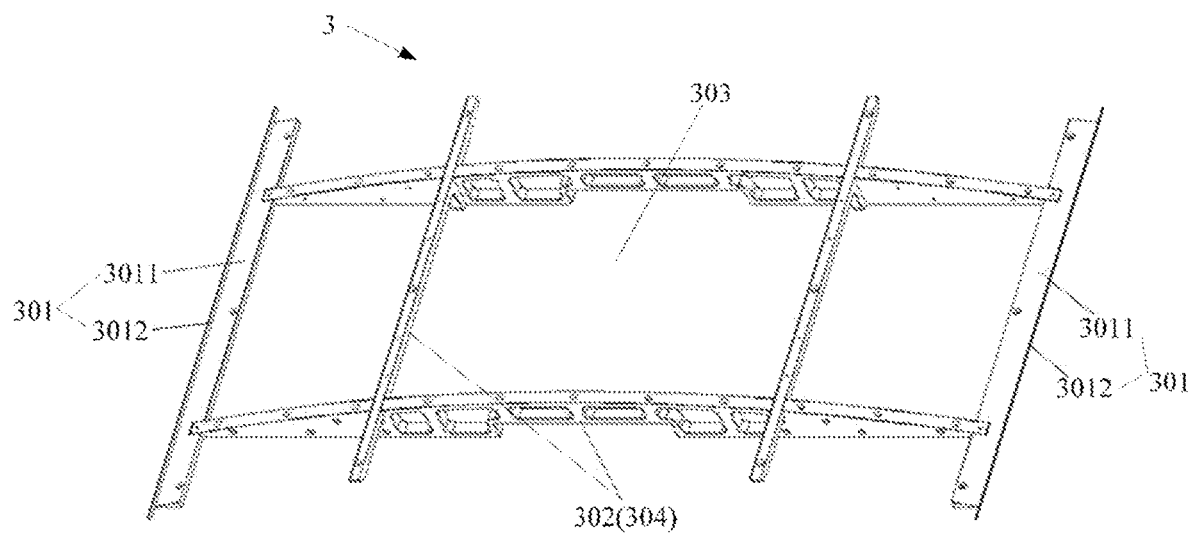
FIG. 4 is a schematic structural diagram of a bracket of a display device according to some exemplary embodiments of the present application.

In some exemplary embodiments, as shown in FIG. 4, the second frame 301 includes a second fixing plate 3011 and a second convex rib 3012 disposed on the second fixing plate 3011, wherein the second fixing plate 3011 is positioned on the second side face 202 (shown in FIG. 3*b*) of the back plate 2, and the second convex rib 3012 abuts against a side edge of the display panel 101 close to the second frame 301. In an example of the present embodiment, the second fixing plate 3011 may be attached to the second side face 202 of the back plate 2, and the second convex rib 3012 may be attached to the side edge of the display panel 101 close to the second frame 301 and a corresponding side edge of the back plate 2.

In some exemplary embodiments, as shown in FIGS. 4 and 3*b*, the bracket 3 further includes multiple support ribs 302 connected between the two second frames 301, and a shape of a surface of the bracket 3 facing the second side face 202 of the back plate 2 is adapted to a shape of the second side face 202 of the back plate 2. In an example of the present embodiment, a shape of the back plate 2 is adapted to a shape of the display panel 101. For example, the display panel 101 may be planar or curved, while the back plate 2 is correspondingly planar, curved. The shape of the surface of the bracket 3 facing the second side face 202 of the back plate 2 may be consistent with the shape of the second side face 202 of the back plate 2 (planar or curved, this surface of the bracket 3 in FIG. 4 is curved). Exemplarily, the two second frames 301 are disposed in parallel, and the multiple support ribs 302 (four mutually perpendicular support ribs 302 are shown in FIG. 4) may be disposed crosswise and connected between the two second frames 301. Connecting between the multiple support ribs 302, as well as between the support ribs 302 and the two second frames 301 may be made by fasteners such as screws or rivets, thereby assembling the bracket 3. The bracket 3 is fixed on the second side face 202 of the back plate 2 by screws or rivets penetrating between the multiple support ribs 302 and the back plate 2, and screws or rivets penetrating between the second frame 301 and the back plate 2. The surface of the bracket 3 facing the second side face 202 of the back plate 2 is a face formed together by a face of the multiple support ribs 302 facing the second side face 202 of the back plate 2 and a face of the two second frames 301 facing the second side face 202 of the back plate 2. The whole bracket 3 may be designed as a symmetrical structure, so as to uniformly support the whole back plate 2, which may also reduce processing difficulty of the bracket 3 and save materials. As shown in FIG. 3*b*, dashed lines on the second side face 202 of the back plate 2 represent fixing positions of four support ribs 302 and two second frames 301 of the bracket 3, and black dots on the dashed lines represent positions of screws or rivets connecting the bracket 3 with the back plate 2.

Figure 5A:
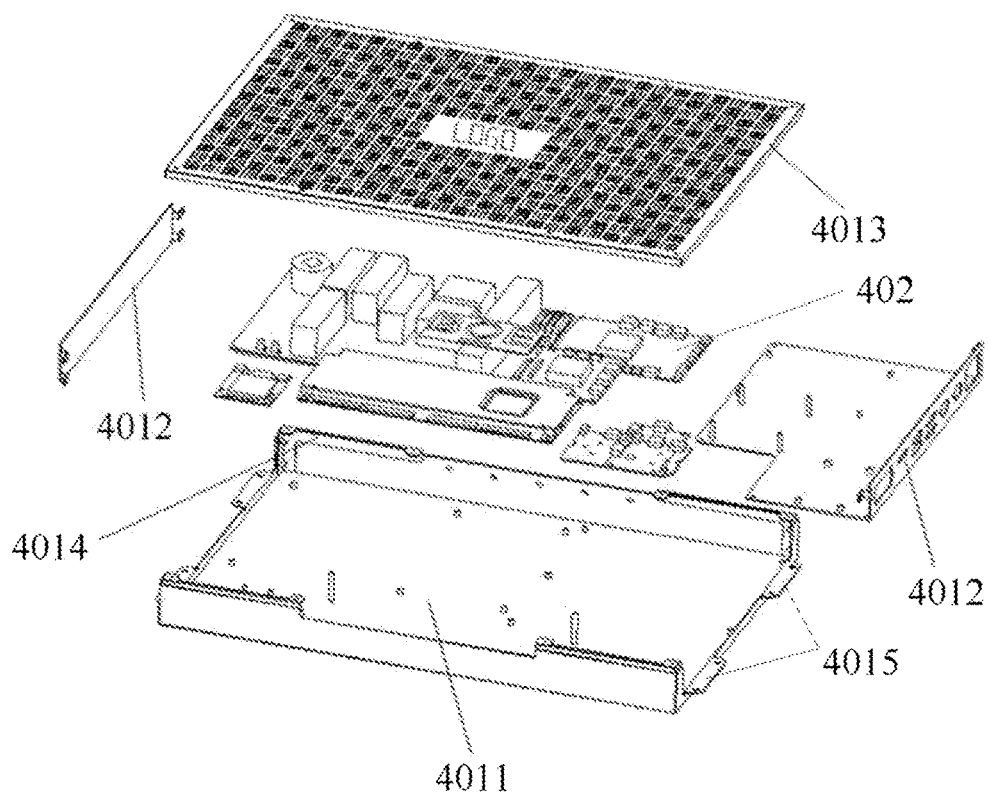
FIG. 5a is a schematic explosion structural diagram of a system circuit module of a display device according to some exemplary embodiment of the present application.
Figure 5B:
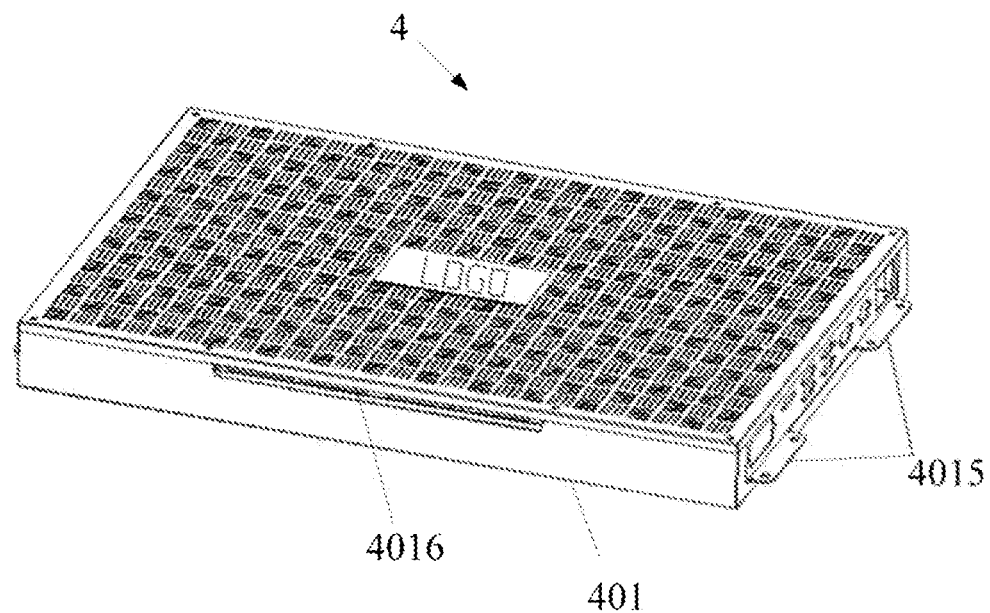
FIG. 5b is a schematic overall structural diagram of a system circuit module of FIG. 5a in some exemplary embodiments of the present application.

In some exemplary embodiments, as shown in FIG. 4, FIG. 5*a*, FIG. 5*b*, and FIG. 6, the display device further includes a system circuit module 4, wherein the system circuit module 4 includes a box body 401 and a system circuit board 402 disposed in the box body 401, and the box body 401 is fixed on the bracket 3. In an example of the present embodiment, as shown in FIG. 4, the multiple support ribs 302 and the two second frames 301 of the bracket 3 cross horizontally and vertically. The box body 401 of the system circuit module 4 may be positioned in an accommodating part 303 formed between the multiple supporting ribs 302, and fixed on the bracket 3. As shown in FIGS. 5*a* and 5*b*, the box body 401 is disposed to bear a system circuit board 402 and another electronic device, and the box body 401 may have a cubic structure. The box body 401 may include a main body of box body 4011, two side plates 4012 respectively disposed on two sides of the main body of box body 4011, and a cover plate 4013 covering the main body of box body 4011. A connecting bracket 4014 may be welded or fastened onto the main body of box body 4011, and the cover plate 4013 is fixed on the main body of box body 4011 by connecting with the connecting bracket 4014. A wiring hole 4016 may be disposed on the box body 401, and the system circuit board 402 in the box body 401 is electrically connected with the driving circuit board 1015 of the display panel 101 through wiring penetrating the wiring hole 4016. All external ports may be integrated on one side plate 4012 of the box body 401. Multiple heat dissipation holes and a product logo may be disposed on the cover plate 4013. Flanges 4015 may be disposed on both of two opposite side plates 4012 of the box body 401, and the box body 401 is fixed on the bracket 3 by screws penetrating between the flanges 4015 and the bracket 3.

Figure 6:
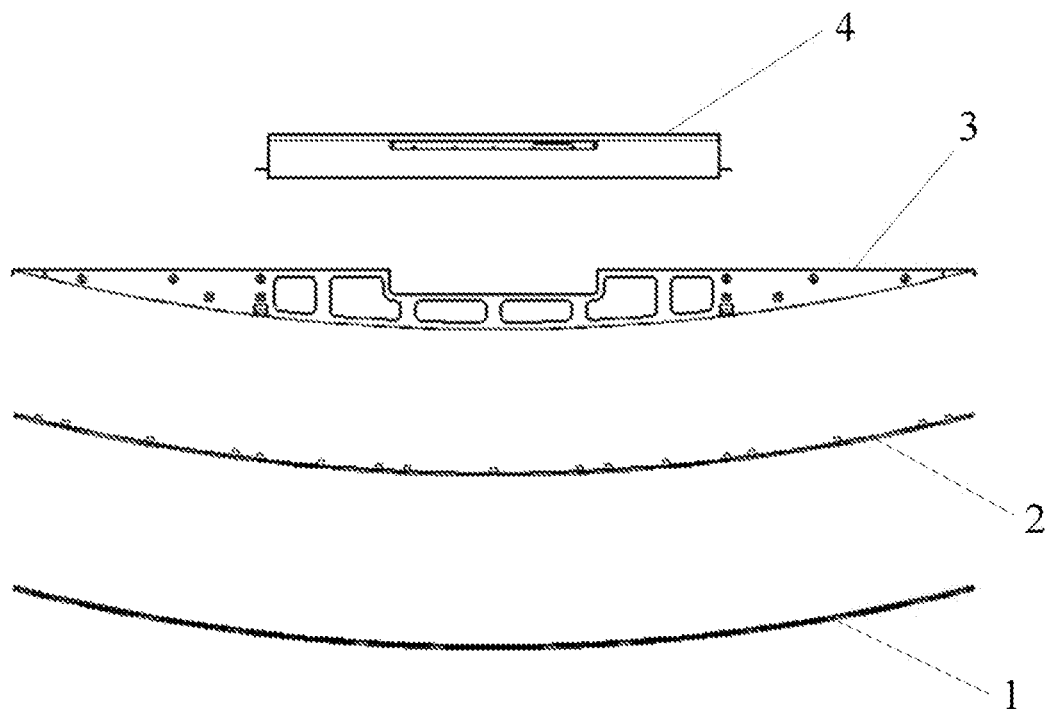
FIG. 6 is a schematic explosion structural diagram of a display device according to some exemplary embodiments of the present application.

In some exemplary embodiments, as shown in FIG. 6, an assembly process of the whole display device may be: first, the bracket 3 is fixed (in a fastener connection mode) on the second side face 202 (shown in FIG. 3*b*) of the back plate 2, and curvature or flatness of both (when the display panel 101 is a curved panel or a flat panel) are ensured to be consistent; then, the side face of the display module 1 facing away from the display side is fixed (pasted or magnetically adsorbed) on the first side face 201 (shown in FIG. 3*a*) of the back plate 2; and finally, after the system circuit module 4 is fixed on the bracket 3, the display module 1 and the system circuit module 4 are electrically connected by wiring, thus completing assembly of the display device.

As shown in FIG. 6, compared with the OLED display device mentioned above, the display device of the present embodiment omits an independent frame body module, and the whole machine is simplified to four modules: a display module 1, a back plate 2, a bracket 3, and a system circuit module 4. In the display device of the present embodiment, the back plate 2 and the bracket 3 may be produced by a same manufacturer, the display module 1 may be produced by one manufacturer, and the system circuit module 4 may be produced by one manufacturer. After the above modularization, the display device of the present embodiment may be assembled to form a product by simple fastening and wiring, and production and assembly of the whole machine are more efficient and convenient.

In some exemplary embodiments, connection and assembly of the display module 1 and the back plate 2 may be fixed together by colloid pasting or magnet adsorption. Since the display panel 101 is relatively light and fragile, in order to reduce excessive carrying of the display panel 101 during an assembly process, an auxiliary part such as colloid, a magnet, or the like may be integrated and modularized with the back plate 2 or the display module 1, that is, an auxiliary part such as colloid, a magnet, or the like are pre-disposed on the back plate 2 or the display module 1. In this way, fast assembly may be performed when the display module 1 and the back plate 2 are connected and assembled. In an example of the present embodiment, as shown in FIG. 3*a*, the first side face 201 of the back plate 2 is disposed with soft magnetic adhesive, wherein the soft magnetic adhesive magnetically attracts the side face of the display panel 101 facing away from the display side. For example, the soft magnetic adhesive may be pasted within a dotted frame where B1 is positioned. An area within two dashed frames where B2 is positioned may be pasted with an insulator to prevent circuit conduction between the driving circuit board 1015 (shown in FIG. 2b) bound on the display panel 101 and the back plate 2 with a metal material.

Figure 7:
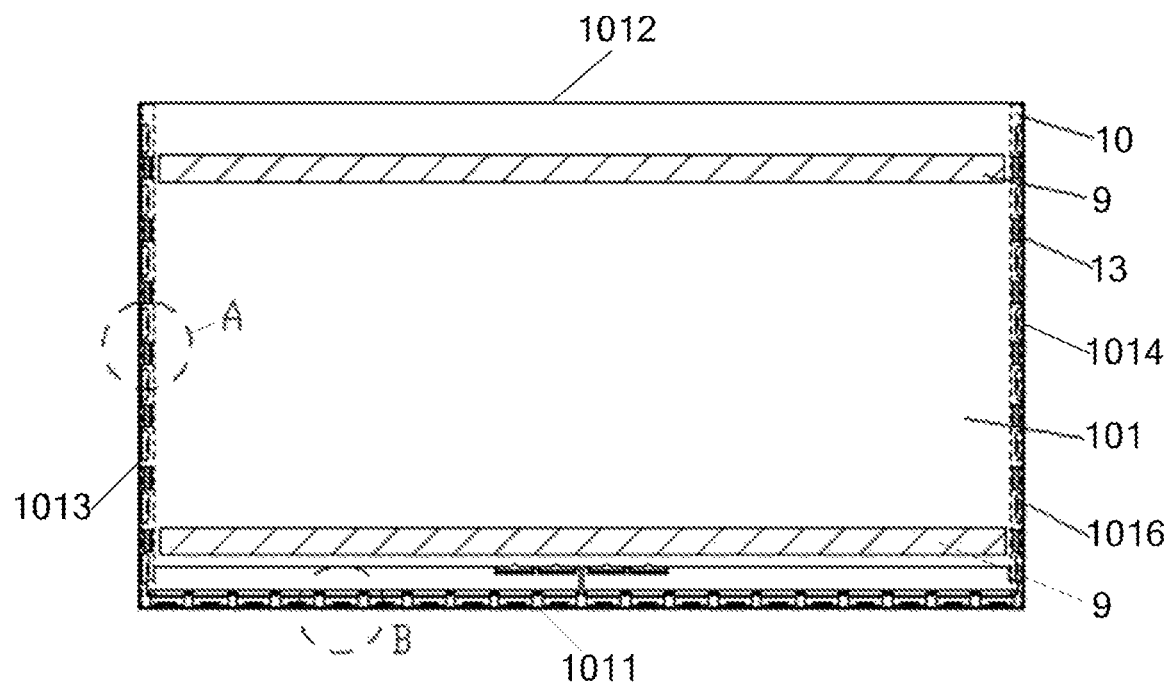
FIG. 7 is a schematic structural diagram of a side face, which faces away from a display side, of a display panel in a display device in some technologies.
Figure 8:
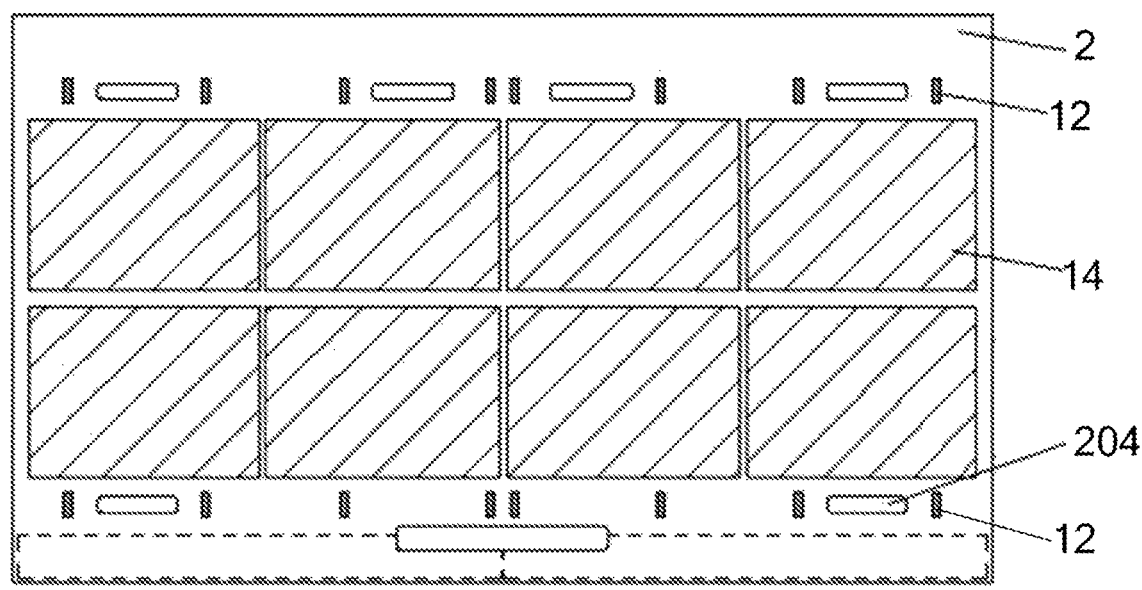
FIG. 8 is a schematic structural diagram of a first side face of a back plate, which is matched with the display panel of FIG. 7, in a display device in some technologies.

With regard to the connection and the assembly of the display module 1 and the back plate 2, for some ultra-thin curved display panels, it is a great test for self-characteristics of brittleness of the display panel (for example, a display panel whose base material quality is glass). Although there are many structures at present which can realize connection and fixing of the display panel 101 and the back plate 2, yield of the display module 1 when assembled with the back plate 2 is always unable to be guaranteed. In some OLED display devices, as shown in FIG. 7 and FIG. 8, the display panel 101 includes opposite first and second sides 1011 and 1012, and opposite third and fourth sides 1013 and 1014. First metal strips 9 are disposed at both of a position close to the first side edge 1011 and a positions close the second side edge 1012, on the side face of the display panel 101 facing away from the display side, multiple first magnets 12 are disposed at positions corresponding to the first metal strips 9 on the first side face 201 of the back plate 2, and the first metal strips 9 are magnetically adsorbed with the first magnets 12. Multiple gate chip on films 1016 are disposed at both a position close to the third side edge 1013 and a position close to the fourth side edge 1014, on the side face of the display panel 101 facing away from the display side, wherein the multiple gate chip on films 1016 on each side edge are fixed on the second metal strip 10, the second metal strip 10 is fixed on the side face of the display panel 101 facing away from the display side, multiple second magnets 13 are disposed at a position of a gap on the second metal strip 10 and between the multiple gate chip on films 1016, and the multiple second magnets 13 are magnetically adsorbed with a corresponding position of the first side face 201 of the back plate 2. In addition, soft magnetic adhesive 14 is disposed in a middle area of the first side face 201 of the back plate 2, and the soft magnetic adhesive 14 is magnetically adsorbed to a middle area of the display panel 101. Herein, a magnetic strength of the soft magnetic glue 14 is smaller than that of the first magnet 12 and the second magnet 13.

Figure 9:
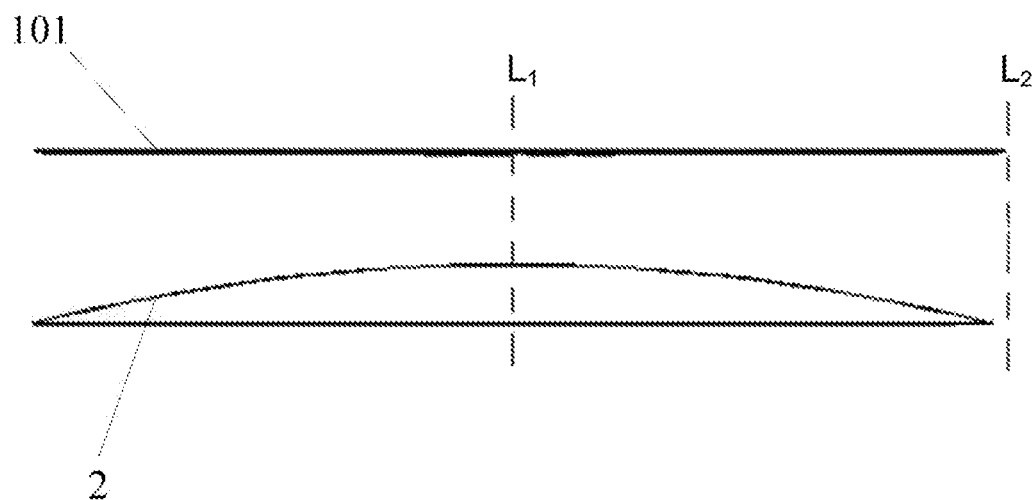
FIG. 9 is a schematic structural diagram of the display panel of FIG. 7 and the back plate of FIG. 8, in a connecting and assembling process, in a display device in some technologies.

In the above solution of fixing the display panel 101 and the back plate 2, the principle is that the soft magnetic glue 14 in the middle position of the back plate 2 is used to undertake a main role of adsorbing and fixing the display panel 101 and equalizing a bending stress of the display panel 101 (which is curved). In addition, a border around the display panel 101 is strong magnetically adsorbed and fixed on the back plate 2, by using strong magnetic adsorption between the first magnet 12 on the back plate 2 and the first metal strip 9 at an edge position of the display panel 101, and strong magnetic adsorption between the second magnet 13 at the edge position of the display panel 101 and the back plate 2, so as to prevent an edge part of the display panel 101 from being up. In addition, a dispensing hole 204 is also disposed on the back plate 2. After the display module 1 and the back plate 2 are connected and assembled, the display panel 101 and the back plate 2 are forcibly spliced and fixed by injecting fixing colloid into the dispensing hole 204. As shown in FIG. 9, in an actual assembly process of the display panel 101 and the back plate 2, the back plate 2 is bent first, and then the planar display panel 101 (the display panel 101 is flexible and may be bent when connected and assembled with the back plate 2) is placed on the back plate 2 for assembly. A main problem encountered in the assembly process is alignment between the display panel 101 and the back plate 2. There are two alignment modes, one is to align from a middle line L1 to both edges, and the other is to align the other edge of the display panel 101 with and slowly attach it toward the back plate 2 after alignment at L2. In the first mode, L2 cannot be aligned which is easily caused due to there is no alignment reference. For the flat display panel 101, due to strong magnetic adsorption between the second magnet 13 at an edge position and the back plate 2, if it is not aligned during manual assembly, it is very easy to hit a frame body (in this solution, the frame body has been pre-assembled on the back plate 2), resulting in damage at A (shown in FIG. 7) of the display panel 101. Similarly, when assembling in the second mode, there will be no edge damage. However, in the disassembly process after assembling, since the edge of the display panel 101 needs to be detached from strong adsorption and a position of the first magnet 12 on the back plate 2 and strong magnetically adsorbed with the first metal strip 9 cannot be seen, stress concentration will easily occur in the disassembly process, resulting in a transverse edge B (shown in FIG. 7) of the display panel 101 cracking.

Figure 10:
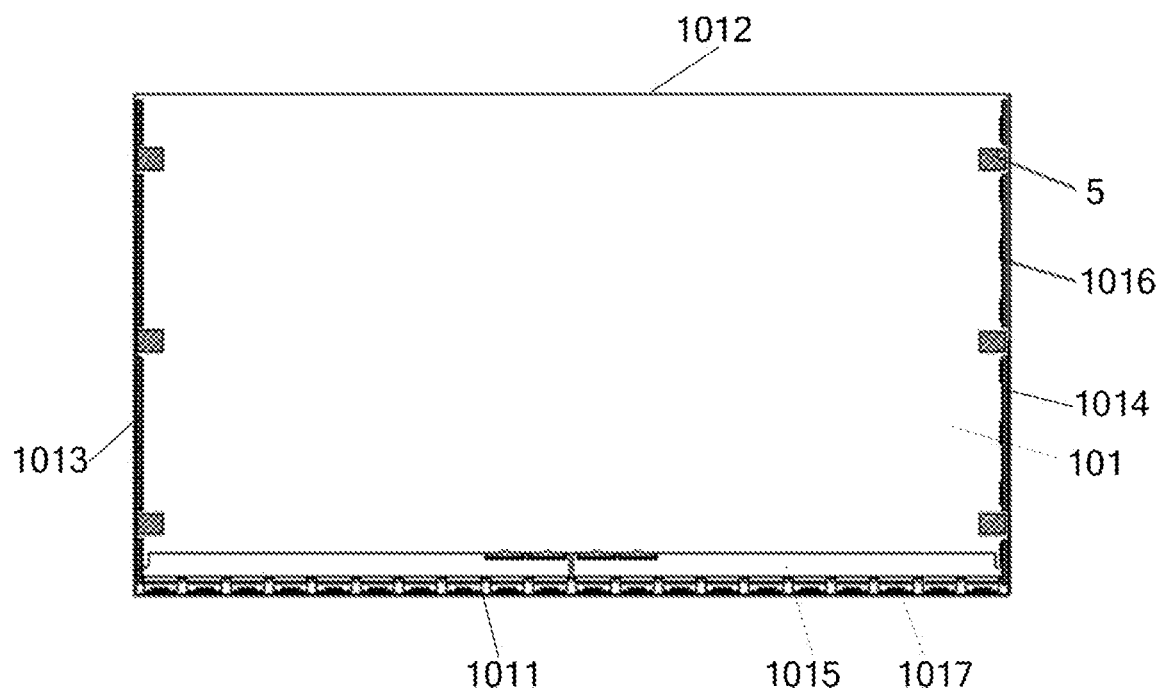
FIG. 10 is a schematic structural diagram of a side face, which faces away from a display side, of a display panel in a display device according to some exemplary embodiments of the present application.
Figure 11:
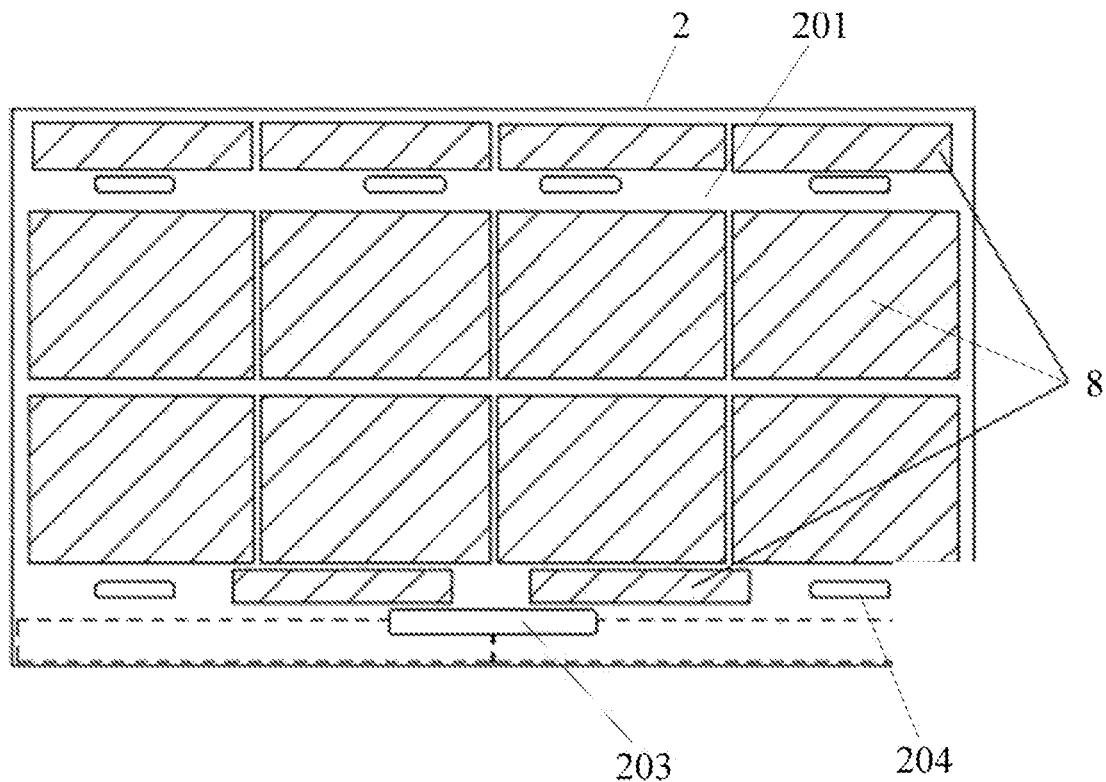
FIG. 11 is a schematic structural diagram of a first side face of a back plate matched with the display panel of FIG. 10 in a display device according to some exemplary embodiments of the present application.
Figure 14:
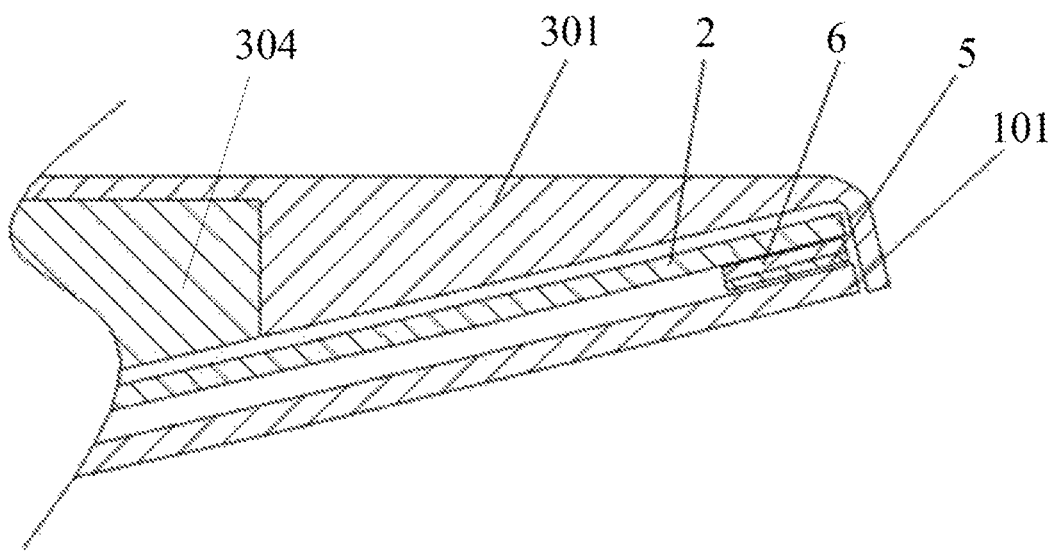
FIG. 14 is a schematic structural diagram after connecting and assembling of the display panel of FIG. 10 and the back plate of FIG. 11 are completed (a second frame has been installed) in some exemplary embodiments of the present application.

For the above-mentioned solution of fixing the display panel 101 and the back plate 2, it being easy to cause a problem of rising damage rate of the display panel 101 in processes of connecting, assembling, and disassembling the display module 1 and the back plate 2, an embodiment of the present application provides another solution of fixing the display panel 101 and the back plate 2. In some exemplary embodiments, as shown in FIG. 10, FIG. 11, and FIG. 14, in the side face of the display panel 101 facing away from the display side, the position close to the first side edge 1011, the position close to the second side edge 1012, and an intermediate position between the first side edge 1011 and the second side edge 1012 are all magnetically adsorbed with the first side face 201 of the back plate 2 through the first magnetic member 8. In the side face of the display panel 101 facing away from the display side, the position close to the third side edge 1013 and the position close to the fourth side edge 1014 are both magnetically adsorbed with the first side face 201 of the back plate 2 through the second magnetic member 6 (shown in FIG. 14). A magnetic strength of the first magnetic member 8 is smaller than that of the second magnetic member 6.

In the present embodiment, only the position close to the third side edge 1013 and the position close to the fourth side edge 1014 of the side face of the display panel 101 facing away from the display side are strong magnetically (the second magnetic member 6 is strong magnetic relative to the first magnetic member 8) adsorbed with the back plate 2, and the position close to the first side edge 1011, the position close to the second side edge 1012, and the middle position of the side face of the display panel 101 facing away from the display side are all weak magnetically (the first magnetic member 8 is weak magnetic relative to the second magnetic member 6) adsorbed with the backboard 2. In this way, compared with the solutions shown in FIGS. 7 and 8, strong magnetic adsorption is reduced by rationally arranging disposed positions of a strong magnetic material and a weak magnetic material, and damage risk generated by a too big stress of the display panel 101 in the assembly process of the display module 1 and the backboard 2 is reduced, which makes the above assembly process be suitable for being performed manually or by an automation line.

Figure 12:
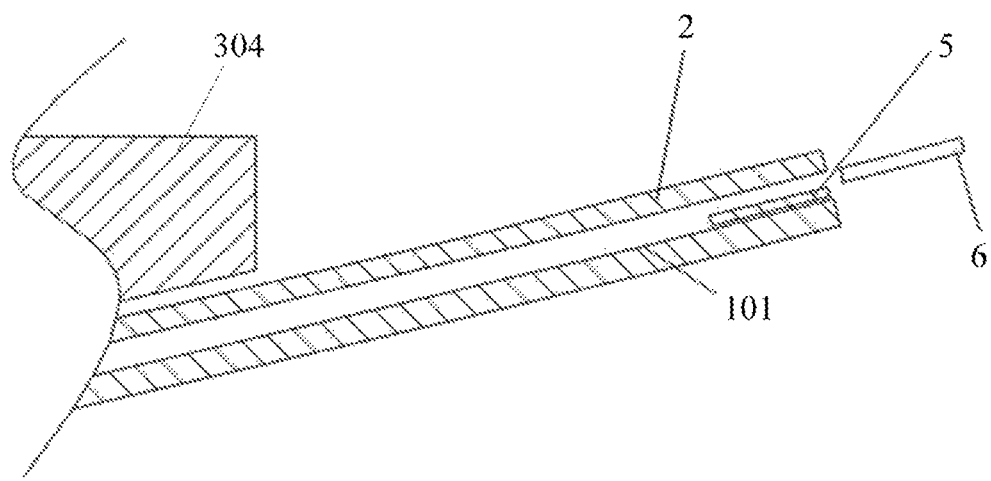
FIG. 12 is a schematic structural diagram of that a second magnetic member is to be inserted after the display panel of FIG. 10 and the back plate of FIG. 11 are aligned by adsorption through a first magnetic member in some exemplary embodiments of the present application.
Figure 13:
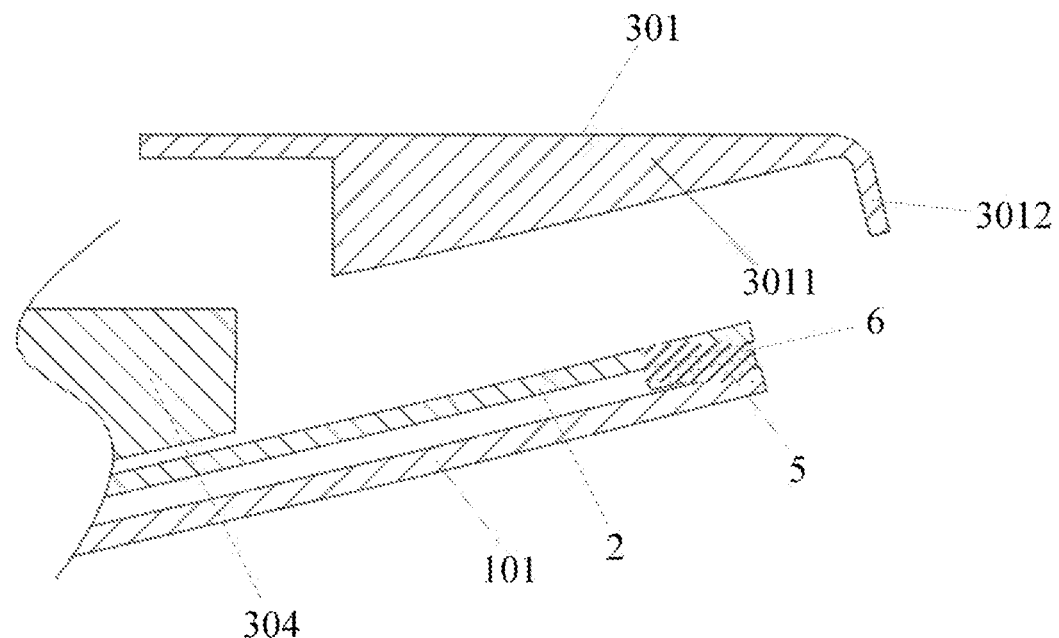
FIG. 13 is a schematic structural diagram of that a second frame is to be installed after a second magnetic member is inserted between the display panel of FIG. 10 and the back plate of FIG. 11 in some exemplary embodiments of the present application.

Based on a fixing solution of the display panel 101 and the back plate 2 in the present embodiment, in some exemplary embodiments, as shown in FIGS. 10 to 14, a process of connecting and assembling the display module 1 and the back plate 2 may be: first, the display panel 101 and the back plate 2 are aligned by adsorption through the first magnetic member 8 disposed on the back plate 2 (in this process, if alignment is incorrect, simple adjustment may be made to ensure edge alignment of the display panel 101 and the back plate 2, as shown in FIG. 12); then, as shown in FIG. 13, the second magnetic member 6 is inserted between the display panel 101 and the back plate 2 from the edge of the display panel 101, so that the position close to the third side edge 1013 and the position close to the fourth side edge 1014, of the display panel 101, are both fixed to the back plate 2 by strong magnetic (relative to the first magnetic member 8) adsorption; and finally, as shown in FIG. 14, frames (two second frames 301 in an example of the present embodiment) corresponding to the third side edge 1013 and the fourth side edge 1014 of the display panel 101 are installed.

Figure 15:
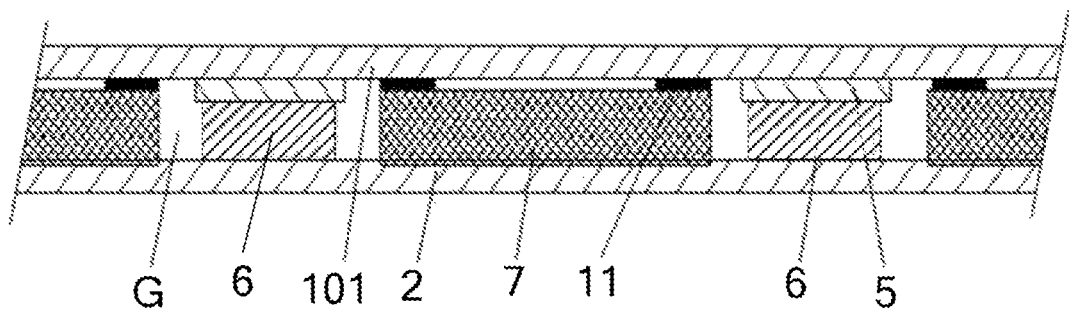
FIG. 15 is a local cross-section diagram of a display device according to some exemplary embodiments of the present application.

When both of the display module 1 and the back plate 2 are disassembled and separated, a disassembly sequence may be opposite to the assembly sequence of the two. First, the frames (such as two second frames 301) corresponding to the third side edge 1013 and the fourth side edge 1014 of the display panel 101 are removed, then the second magnetic member 6 is removed from between the display panel 101 and the back plate 2 (as shown in FIG. 15, the second magnetic member 6 may be drawn out from the edge of the display panel 101 by using a gap G on both sides of the second magnetic member 6), finally the display panel 101 and the back plate 2 are gradually separated from an edge position (this separation process is only separation of weak magnetic), and finally the display panel 101 and the back plate 2 are separated apart. Therefore, in the display device of the present embodiment, the connection and assembly method of the display module 1 and the back plate 2 is optimized by rationally arranging disposed positions of the strong magnetic material and the weak magnetic material, and the strong magnetic material and the weak magnetic material are installed and removed separately (i.e., asynchronously) during the assembly and disassembly of the display module 1 and the back plate 2, which may completely avoid risk of collision of the edges of the display panel 101, greatly reducing damage rate of the display panel 101 during the assembly and disassembly process of the display module 1 and the back plate 2.

As shown in FIG. 4, in an example of the present embodiment, the bracket 3 includes two second frames 301, wherein the two second frames 301 are respectively disposed close to the third side edge 1013 and the fourth side edge 1014 of the display panel 101. That is, the frames corresponding to the third side edge 1013 and the fourth side edge 1014 of the display panel 101 are both the second frame 301. The two second frames 301 are detachably connected onto a main body of bracket 304 of the bracket 3, the main body of bracket 304 may be a part of the bracket 3 excluding the second frames 301, and the main body of bracket 304 may include the multiple support ribs 302. As shown in FIGS. 12 and 13, before connecting and assembling the display module 1 and the back plate 2, the main body of bracket 304 of the bracket 3 may be installed on the second side face 202 of the back plate 2 in advance, and after the second magnetic member 6 is to be inserted between the display panel 101 and the back plate 2, the two second frames 301 are installed on the main body of bracket 304.

In some exemplary embodiments, as shown in FIG. 11, the first magnetic member 8 is attached to the first side face 201 of the back plate 2, and a material of the first magnetic member 8 includes a soft magnetic material. In an example of the present embodiment, the first magnetic member 8 may be sheet or strip soft magnetic adhesive. The first magnetic members 8 may be uniformly disposed on the first side face 201 of the back plate 2, so that a stress of the whole back plate 2 is more uniform. The display panel 101 may include a support layer made of a metal material (such as a stainless steel material), which may play a role of heat dissipation and support. The first magnetic member 8 on the back plate 2 may magnetically adsorb with a supporting layer of the display panel 101.

In some exemplary embodiments, as shown in FIG. 10, FIG. 14, and FIG. 15, in the side face of the display panel 101 facing away from the display side, multiple metal sheets 5 are disposed at both a position close to the third side edge 1013 and a position of the fourth side edge 1014, and the metal sheets 5 and the first side face 201 of the back plate 2 are magnetically adsorbed by the second magnetic member 6 adsorbed between them. In an example of the present embodiment, a second magnetic member 6 is correspondingly adsorbed between a metal sheet 5 and the back plate 2, and each second magnetic member 6 is inserted between a corresponding metal sheet 5 and the back plate 2 during installation. A quantity of the metal sheets 5 may be set according to an adsorption strength actually required. A material quality of the back plate 2 may be metal, so that the back plate 2 may directly magnetically adsorb with the second magnetic member 6. The second magnetic member 6 may be a ferrite magnet, a neodymium iron boron magnet, an alnico magnet, etc.

In some exemplary embodiments, as shown in FIG. 15, in the side face of the display panel 101 facing away from the display side, a buffer pad 7 is disposed in a gap between the position close to the third side edge 1013 and the position close to the fourth side edge 1014 and the first side face 201 of the back plate 2. In an example of the present embodiment, a material of the buffer pad 7 may be a flexible material, such as rubber, foam, etc. The second magnetic member 6 is disposed between the display panel 101 and the back plate 2, then a gap will be generated at an edge position between the display panel 101 and the back plate 2 where the second magnetic member 6 is not disposed, and the buffer pad 7 may play a role of filling the gap and buffering. The buffer pad 7 may be spliced to the display panel 101 or the back plate 2 by double faced adhesive tape 11 or adhesive.

In some exemplary embodiments, as shown in FIG. 11, the back plate 2 is further disposed with multiple dispensing holes 204, wherein fixing colloid splicing the back plate 2 and the display panel 101 together is disposed in the dispensing holes 204. In an example of the present embodiment, multiple dispensing holes 204 may be distributed on the whole back plate 2 to splice and fix the display panel 101 and the back plate 2.

In the description of the embodiments of the present application, the terms "connection", "fixed connection", "installation" and "assembly" should be understood broadly, for example, they may be fixed connection, or they may be detachable connection, or they may be integrally connected, unless explicitly specified and limited otherwise. The terms "installation", "connection" and "fixed connection" may be directly connected, or may be indirectly connected through an intermediate medium, or may be an internal connection between two elements. Those of ordinary skill in the art can understand meanings of the above mentioned terms in the embodiments of the present application.

What is claimed is:
1. A display apparatus, comprising a display module, a back plate, and a bracket; wherein a side face of the display module is used for displaying, an opposite side face of the display module is fixed on a first side face of the back plate, and the bracket is fixed on a second side face of the back plate facing away from the first side face; and the display module comprises a display panel and a first frame, the first frame is disposed on a part of the display panel close to an edge, the bracket comprises a second frame, and the display panel is positioned on an inner side of a frame body formed by the first frame and the second frame;

wherein:

the display panel comprises opposite first and second side edges, and opposite third and fourth side edges;

the display module comprises two first frames, and the two first frames are respectively disposed on a part close to a first side edge and a part close to a second side edge of the display panel; and the bracket comprises two second frames, and the two second frames are respectively disposed close to the third side edge and the fourth side edge of the display panel.

2. The display device of claim 1, wherein:

the first frame comprises a first fixing plate and a first convex rib disposed on the first fixing plate, the first fixing plate is fixed on a side face of the display panel facing away from a display side, and the first convex rib abuts against a side edge of the display panel close to the first frame.

3. The display device of claim 2, wherein:

the display module further comprises a plurality of chip on films disposed at the first side edge of the display panel, and at least one driving circuit board bound and connected with the plurality of chip on films, the chip on films and the driving circuit board are fixed on a side face of the display panel facing away from the display side, and an avoidance part avoiding the chip on films is disposed on the first fixing plate.

4. The display device of claim 3, wherein:

the second frame comprises a second fixing plate and a second convex rib disposed on the second fixing plate, the second fixing plate is positioned on the second side face of the back plate, and the second convex rib abuts against a side edge of the display panel close to the second frame.

5. The display device of claim 2, wherein:

the second frame comprises a second fixing plate and a second convex rib disposed on the second fixing plate, the second fixing plate is positioned on the second side face of the back plate, and the second convex rib abuts against a side edge of the display panel close to the second frame.

6. The display device of claim 1, wherein:

the second frame comprises a second fixing plate and a second convex rib disposed on the second fixing plate, the second fixing plate is positioned on the second side face of the back plate, and the second convex rib abuts against a side edge of the display panel close to the second frame.

7. The display device of claim 1, wherein:

the bracket further comprises a plurality of support ribs connected between the two second frames, and a shape of a surface of the bracket facing the second side face of the back plate is adapted to a shape of the second side face of the back plate.

8. The display device of claim 1, further comprising a system circuit module, wherein the system circuit module comprises a box body and a system circuit board disposed in the box body, and the box body is fixed on the bracket.

9. The display device of claim 1, wherein:

in a side face of the display panel facing away from a display side, a position close to the first side edge, a position close to the second side edge, and an intermediate position between the first side edge and the second side edge are all magnetically adsorbed with the first side face of the back plate by a first magnetic member;

in the side of the display panel facing away from the display side, a position close to the third side edge and a position close to the fourth side edge are both magnetically adsorbed with the first side face of the back plate through a second magnetic member; and a magnetic strength of the first magnetic member is smaller than that of the second magnetic member.

10. The display device of claim 9, wherein: the first magnetic member is attached on the first side face of the back plate, and a material of the first magnetic member comprises a soft magnetic material.

11. The display device of claim 9, wherein: in the side face of the display panel facing away from the display side, a plurality of metal sheets are disposed at both of a position close to the third side edge and a position close to the fourth side edge, and the metal sheets and the first side face of the back plate are magnetically adsorbed by the second magnetic member adsorbed between both of them.

12. The display device of claim 11, wherein: in the side face of the display panel facing away from the display side, a buffer pad is disposed in a gap between the position close to the third side edge and the position close to the fourth side edge and the first side face of the back plate.

13. The display device of claim 9, wherein: a plurality of dispensing holes are further disposed on the back plate, and fixing colloid for splicing the back plate and the display panel together is disposed in the dispensing holes.

14. The display device of claim 1, wherein:

the second frame comprises a second fixing plate and a second convex rib disposed on the second fixing plate, the second fixing plate is positioned on the second side face of the back plate, and the second convex rib abuts against a side edge of the display panel close to the second frame.

* * * * *